United States Patent
Kim

(10) Patent No.: US 8,064,277 B2
(45) Date of Patent: Nov. 22, 2011

(54) CONTROL CIRCUIT OF READ OPERATION FOR SEMICONDUCTOR MEMORY APPARATUS

(75) Inventor: Kwi Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 145 days.

(21) Appl. No.: 12/493,647

(22) Filed: Jun. 29, 2009

(65) Prior Publication Data

US 2010/0033221 A1 Feb. 11, 2010

(30) Foreign Application Priority Data

Aug. 8, 2008 (KR) .......................... 10-2008-0077692

(51) Int. Cl.
*G11C 7/00* (2006.01)
(52) U.S. Cl. .............. 365/194; 365/189.04; 365/189.05; 365/230.08
(58) Field of Classification Search .................. 365/194, 365/205, 189.05, 230.08
See application file for complete search history.

(56) References Cited

U.S. PATENT DOCUMENTS

| | | | |
|---|---|---|---|
| 5,883,851 A | 3/1999 | Lee | |
| 6,721,213 B2 * | 4/2004 | Nakayama et al. | 365/194 |
| 6,765,830 B2 * | 7/2004 | Huang et al. | 365/194 |
| 6,944,090 B2 * | 9/2005 | Anand et al. | 365/189.15 |
| 7,208,975 B1 | 4/2007 | Agrawal et al. | |
| 7,692,466 B2 * | 4/2010 | Ahmadi | 327/218 |
| 2009/0052218 A1 | 2/2009 | Kang | |

FOREIGN PATENT DOCUMENTS

KR 1020070089557 A 8/2007
KR 1020080076087 A 8/2008

* cited by examiner

*Primary Examiner* — Pho M Luu
(74) *Attorney, Agent, or Firm* — Ladas & Parry LLP

(57) ABSTRACT

A control circuit for a read operation of a SERDES (SERializer and DESeriallizer) type semiconductor memory apparatus is disclosed that includes a first delay unit that is configured to generate and output a first delay signal to a first global input/output line driver by receiving a sensing-enable signal 'IOSTB', and to generate and output a second delay signal to a second global input/output line driver by receiving the sensing-enable signal. The first delay unit generates the second delay signal by delaying the sensing-enable signal in synchronization with a clock. The semiconductor memory apparatus also includes a second delay unit configured to generate a pipe latch control signal in response to the first delay signal and the second delay signal.

16 Claims, 5 Drawing Sheets

315

317

CONTROL CIRCUIT OF READ OPERATION FOR SEMICONDUCTOR MEMORY APPARATUS

CROSS-REFERENCES TO RELATED PATENT APPLICATION

The present application claims priority under 35 U.S.C 119(a) to Korean Application No. 10-2008-0077692, filed on Aug. 8, 2008, in the Korean Intellectual Property Office, which is incorporated herein by reference in its entirety as set forth in full.

BACKGROUND

1. Technical Field

The present invention described herein generally relates to a semiconductor memory apparatus, and more particularly, to a control circuit of a read operation for a semiconductor memory apparatus.

2. Related Art

Typical semiconductor memory apparatuses use a parallel input/output system for exchanging data with an external chipset using a single port having a plurality of input/output pins. The parallel input/output has an advantage of processing data at a high speed since the parallel input/output can simultaneously transmit several bits of data.

However, the parallel input/output has a disadvantage in that the number of buses required for transmitting data increases and the more the data transmission distance increases, which results in an increased unit cost of the product.

A SERDES (SERializer and DESeriallizer) has been used in the conventional art in order to supplement the disadvantages of the parallel input/output. In the SERDES, a semiconductor memory apparatus is provided with two or more ports with each port including a SERDES circuit. Each of the ports converts series signals that are externally inputted into parallel signals and transmits them to a memory bank, and also converts parallel signals that are inputted from the memory bank into series signals and outputs them to the outside.

According to these operations, a SERDES type memory apparatus can reduce the number of bus lines required.

In the SERDES, at least two write/read operations are executed for every one write/read command. Accordingly, in a SERDES type semiconductor memory apparatus having a CAS-to-CAS is delay 'tCCD' of four clocks, one write/read operation should be executed within two clocks.

Presently, the time interval for this operation is fixed. Accordingly, one time period for a write/read operation should be executed within 2 ns for a target frequency of 1 ns. That is, a column selection signal 'YI' for controlling the first write/read operation and a column selection signal 'YI' for controlling the second write/read operation should not be delayed by more than 2 ns.

In addition, the time interval between the two column selection signals 'YI's is a fixed value corresponding to a high-frequency operation, without consideration to the operational speed of the semiconductor memory apparatus. Accordingly, the semiconductor memory apparatus always operates with the predetermined minimum margin.

FIG. 1A and FIG. 1B are circuit diagrams showing a procedure for a command process in a conventional SERDES semiconductor memory apparatus.

First, FIG. 1A is a circuit diagram showing a write operation.

First, a write command 'WT' that is created by a command decoder (not shown) is enabled and supplied to a column decoder 101. The column decoder 101 receives an address signal 'ADD' and the write command 'WT' and creates a first column selection signal 'YI1' and a second column selection signal 'YI2' synchronized with a clock signal 'CLK' supplied to the column decoder 101. The second column selection signal 'YI2' can be a signal that is delayed by a predetermined time interval, e.g., two periods of the clock signal, and in synchronization with the first column selection signal 'YI1'.

Further, data input multiplexers 'MUX1', 'MUX2' 103, 105 each receive the column selection signals 'YI1', 'YI2' and data 'DIN' such that the data can be transmitted to a memory bank. According to this configuration, the input data 'DIN' is inputted to a port after undergoing a predetermined process according to a data strobe signal 'DQS' from a data input pad 'DQ' and is parallelized. Then, the input data 'DIN' is transmitted to the data input multiplexers 103, 105 through a global input/output line 'GIO'.

A write driver 107 transmits the data received from the input multiplexers 'MUX1' and 'MUX2', which receive the input data through the global input/output line, to a memory bank block through a local input/output line 'LIO/LIOb'.

For example, when two write operations are executed for one write command, input data having 8 bits is parallelized to 4 bits-by-4 bits and sequentially inputted through the GIO to the input multiplexers 'MUX1' and 'MUX2'. Further, the data input multiplexer 'MUX1' 103 transmits the first 4 bits of data to the local input/output line 'LIO/LIOb' via the write driver 107 according to the first column selection signal 'YI1'. Thereafter, the data input multiplexer 'MUX2' 105 transmits the second 4 bits of data to the local input/output line 'LIO/LIOb' via the write driver 107 according to the second column selection signal 'YI2' that is outputted after a predetermined time interval (i.e., two clocks).

As described above, it is possible to transmit the data inputted according to the data strobe signal to the memory bank at an exact time since the column selection signals 'YI1' and 'YI2' are created in synchronization with the clock signals during the write operation.

Next, FIG. 1B is a circuit diagram showing a read operation.

As a read command 'RD' is enabled, a column decoder 201 receives an address signal 'ADD' and the read command 'RD' and outputs a column selection signal 'YI'. Accordingly, an input/output sense amplifier 205 receives data 'DOUT' stored in the memory bank block through the local input/output line 'LIO/LIOb' and subsequently amplifies and latches the data.

In response to an output signal of a first delay unit 215, the data amplified by the input/output sense amplifier 205 is transmitted to a pipe latch 213 through global input/output line drivers 207, 209 and a multiplexer 211. In this configuration, the first delay unit 215 delays a sensing-enable signal 'IOSTB' outputted from a sensing-enable signal generator 203 for a predetermined amount of time and then outputs it.

More specifically, a portion (a first data group) of the output signals from the input/output sense amplifier 205 is transmitted to the multiplexer 211 through a global input/output driver according to a first delay signal 'MAO<1>' outputted from the first delay unit 215. The rest (a second data group) of the output signals from the input/output sense amplifier 205 are then transmitted to the multiplexer 211 through a global input/output driver according to a second delay signal 'MAO<2>' outputted from the first delay unit 215. According to this configuration, the second delay signal 'MAO<2>' is a value obtained by delaying the first delay signal 'MAO<1>' by a predetermined time.

The first data group is inputted to the multiplexer 211 and should be stored in the pipe latch 213 before the second data group is inputted to the multiplexer 211. Therefore, first and second pipe latch control signals 'PIN1', 'PIN2' that are created by a second delay unit 217 should be designed so as to have the same delay values as the first and second delay signals 'MAO<1>', 'MAO<2>' that are outputted from the first delay unit 215, respectively.

As described above, the first delay unit 215 and the second delay unit 217 are designed to have a fixed delay time, regardless of the operational speed of a semiconductor memory apparatus. However, the positions of the first delay unit 215 and the second delay unit 217 are designed differently and therefore, there is difficulty in configuring the delay units 215, 217 to have the exact same delay values. As a result, a problem occurs where the data that has been transmitted to the global input/output line is not transmitted to the pipe latch 213 at the exact time. This problem can be exacerbated in a high-frequency operation and cause the semiconductor memory apparatus to malfunction.

Further, since the delay times applied to the first delay unit 215 and the second delay unit 217 are values created by fixing the sensing-enable signal 'IOSTB' for a predetermined time, the first delay unit 215 and the second delay unit 217 operate according to the fixed value, even though the operational margin is sufficient in a low-frequency operation, such that the efficiency of the semiconductor memory apparatus is deteriorated.

SUMMARY

A control circuit of a read operation capable of performing a read operation on the basis of a clock in a SERDES type semiconductor memory apparatus is provided.

A control circuit of a read operation can ensure an operational margin by changing a data output time interval in synchronization with a clock in accordance with the operational frequency in a read operation in a SERDES type semiconductor memory apparatus.

In one embodiment of the present invention, a control circuit of a read operation for a semiconductor memory apparatus which is a control circuit of a read operation for a SERDES type semiconductor memory apparatus includes a first delay unit configured to create and output a first delay signal to a first global input/output line driver by receiving a sensing-enable signal 'IOSTB', and create and output a second delay signal to a second global input/output line driver by receiving the sensing-enable signal and creating the second delay signal obtained by delaying the sensing-enable signal in synchronization with a clock; and a second delay unit configured to create a pipe latch control signal in response to the first delay signal and the second delay signal.

In another embodiment of the present invention, a control circuit of a read operation for a semiconductor memory apparatus which is a control circuit of a read operation for a SERDES type semiconductor memory apparatus includes a first delay unit configured to create and output a first delay signal to a first global input/output line driver by receiving a sensing-enable signal 'IOSTB', and create and output a second delay signal to a second global input/output line driver by creating a second delay signal obtained by delaying the sensing-enable signal in synchronization with a clock; and a second delay unit configured to create a third delay signal by receiving the sensing-enable signal 'IOSTB' and output the third delay signal as a first pipe latch control signal, and create a fourth delay signal obtained by delaying the sensing-enable signal in synchronization with a clock and outputs the fourth delay signal as a second pipe latch control signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments of the present invention will be described in detail with reference to the accompanying drawings.

Figure 1A:
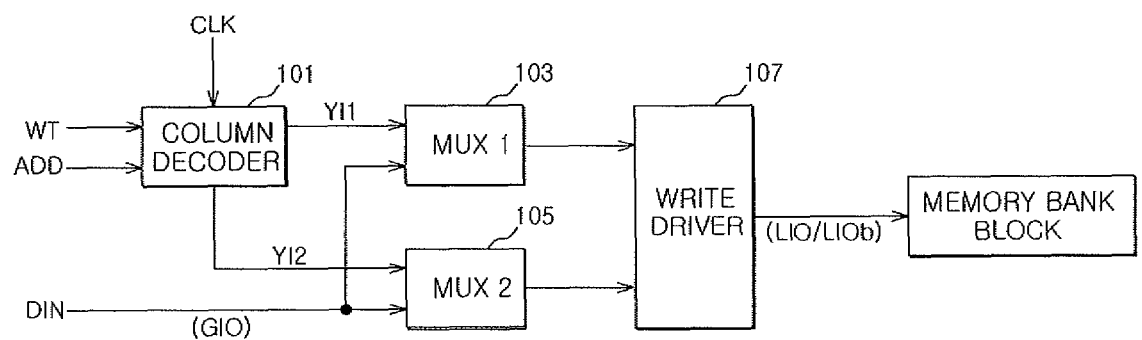
FIG. 1A and FIG. 1B are circuit diagrams showing a procedure for a command process in a conventional SERDES type semiconductor memory apparatus.
Figure 1B:
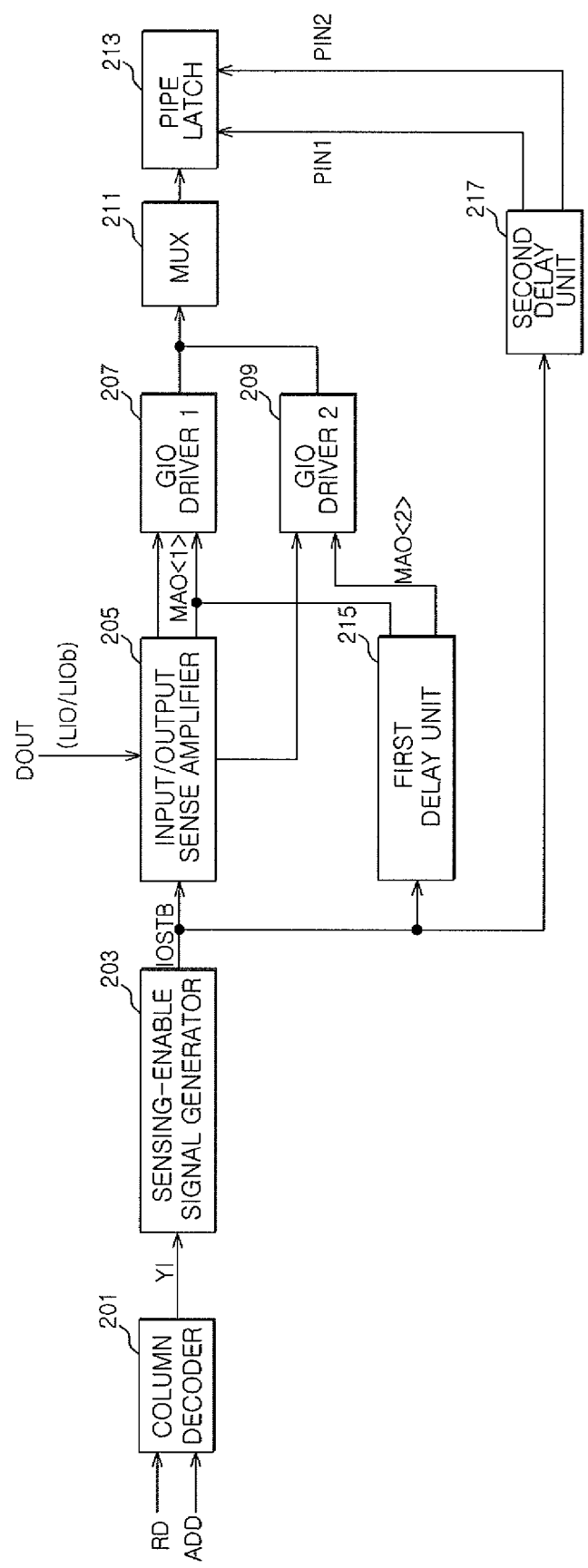
Figure 2:
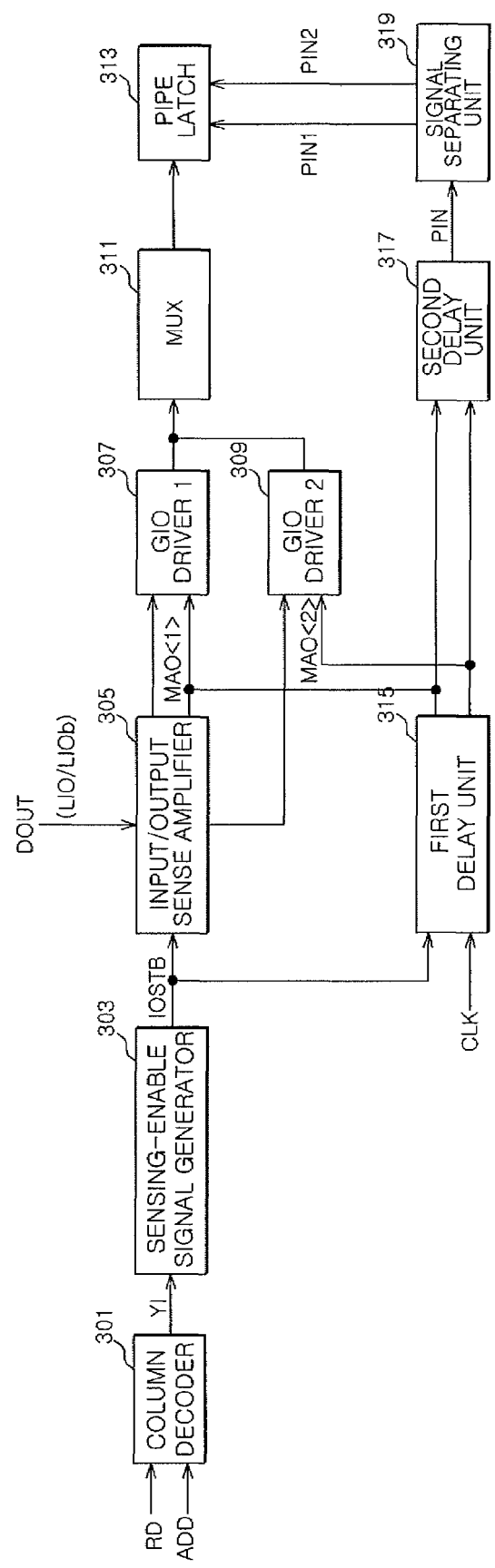
FIG. 2 is a diagram showing the configuration of a control circuit of a read operation according to an embodiment of the present invention.

FIG. 2 is a diagram showing the configuration of a control circuit for a read operation according to an embodiment of the present invention.

A control circuit for a read operation according to an embodiment of the present invention can include a first delay unit 315, a second delay unit 317, and a signal separating unit 319.

The first delay unit 315 receives an sensing-enable signal 'IOSTB' from a sensing-enable signal generator 303 and generates a first delay signal 'MAO<1>' that is provided to a first global input/output line driver 307. The first delay unit 315 also generates a second delay signal 'MAO<2>' by delaying the sensing-enable signal 'IOSTB' in synchronization with a clock signal 'CLK' received at the first delay unit 315 and provides the second delay signal 'MAO<2>' to a second global input/output line driver 309.

A second delay unit 317 generates a pipe latch control signal 'PIN' in response to the first delay signal 'MAO<1>' and the second delay signal 'MAO<2>' outputted from the first delay unit 315.

A signal separating unit 319 generates first and second pipe latch control signals 'PIN1', 'PIN2' from the pipe latch control signal 'PIN' outputted from the second delay unit 317.

The read operation of a semiconductor memory apparatus including the above control circuit for a read operation is described in detail hereafter.

As a read signal 'RD' is enabled, a column decoder 301 receives the read signal 'RD' and an address signal 'ADD' and outputs a column selection signal 'YI'. An input/output sense amplifier 305 receives data 'DOUT' stored in a memory bank block through a local input/output line 'LIO/LIOb', and then amplifies and latches the data.

After the sensing-enable signal 'IOSTB' is outputted from the sensing-enable signal generator 303, the first delay unit 315 outputs the first delay signal 'MAO<1>' by delaying the sensing-enable signal 'IOSTB' for a predetermined time. Thereafter, a first data group is latched in the input/output sense amplifier 305 and is transmitted to a multiplexer 311 according to the first delay signal 'MAO<1>' through a first global input/output line driver 307.

The first data group that is inputted to the multiplexer 311 is stored in a pipe latch 313 in response to a first pipe latch control signal 'PIN1' that is outputted from the signal separating unit 319.

A second data group is then latched in the input/output sense amplifier 305 and is transmitted to the multiplexer 311 through a second global input/output line driver 309 according to the second delay signal 'MAO<2>' that is generated in the first delay unit 315 by delaying the sensing-enable signal 'IOSTB' in synchronization with the clock 'CLK'.

Thereafter, the second data group is stored in the pipe latch 313 in response to a second pipe latch control signal 'PIN2' that is outputted from the signal separating unit 319.

As described above, it is possible to ensure a margin between a low-frequency operation and the read operation since the second delay unit 'MAO<2>' is generated by delaying the sensing-enable signal 'IOSTB' in synchronization with the clock after the first delay signal 'MAO<1>' is outputted.

The data that is stored in the multiplexer 311 is transmitted to the pipe latch 313 according to the pipe latch control signal 'PIN1', 'PIN2', which are generated according to the first delay signal 'MAO<1>' and the second delay signal 'MAO<2>'. Accordingly, the point in time when data is transmitted to the multiplexer 311 and the point in time when the pipe latch 313 stores the data do not overlap.

Figure 3:
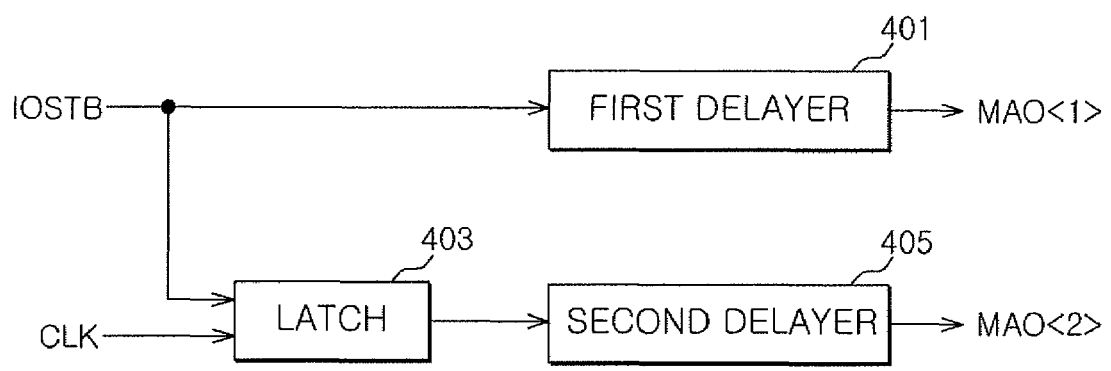
FIG. 3 is a diagram showing the configuration of the first delay unit shown in FIG. 2.

FIG. 3 is a diagram showing the configuration of the first delay unit 315 shown in FIG. 2.

As shown in FIG. 3, the first delay unit 315 is configured to include a first delayer 401, a latch 403, and a second delayer 405.

The first delayer 401 outputs the first delay signal 'MAO<1>' by delaying the sensing-enable signal 'IOSTB' for a predetermined time. The latch 403 shifts the sensing-enable signal 'IOSTB' in synchronization with the clock 'CLK'. The second delayer 405 then outputs the second delay signal 'MAO<2>' by delaying an output signal of the latch 403 for a predetermined time.

According to this configuration, the latch 403 comprises a D-flipflop (not shown) that delays the sensing-enable signal 'IOSTB' by 2 bits in response to the clock 'CLK' signal. It is preferable that the delay amounts of the first delayer 401 and the second delayer 405 are configured to have the same value.

Figure 4:
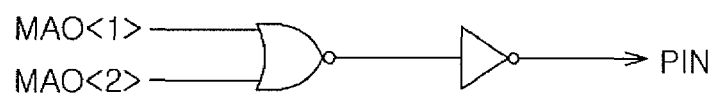
FIG. 4 is a diagram showing the configuration of the second delay unit shown in FIG. 2.

FIG. 4 is a diagram showing the configuration of the second delay unit 317 shown in FIG. 2.

In a preferred embodiment of the present invention, the second delay unit 317 comprises a logic element that receives the first delay signal 'MAO<1>' and the second delay signal 'MAO<2>' and generates a pulse every time one of the received signals is enabled. For example, the logic element can be formed by connecting a NOR gate with an inverter in a series in which the output pulse of the logic element is a pipe latch control signal 'PIN' as shown in FIG. 4.

Though not shown, the signal separating unit 319 comprises a counter. In this configuration, a counting operation is performed every time a pulse is outputted from the second delay unit 317. The counted values are used as the first and second pipe latch control signals 'PIN1', 'PIN2'.

Figure 5:
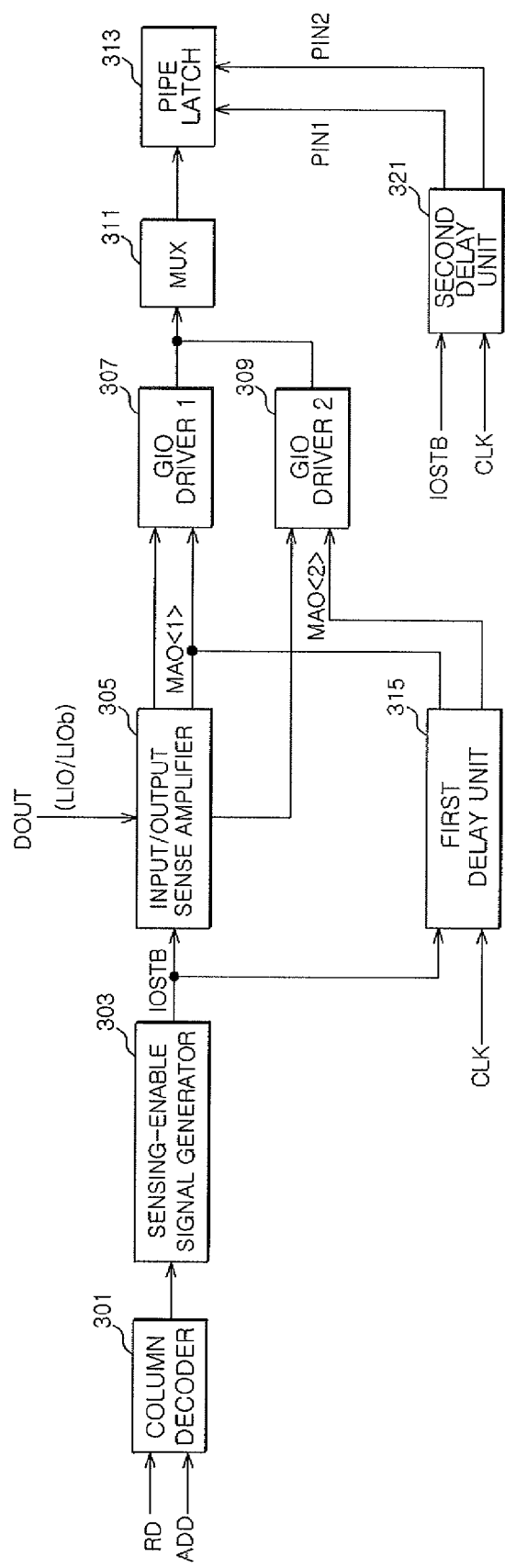
FIG. 5 is a diagram showing the configuration of a control circuit of a read operation according to another embodiment of the present invention.

FIG. 5 is a diagram showing the configuration of a control circuit for a read operation according to another embodiment of the present invention.

In a control circuit for a read operation according to the embodiment of the present invention shown in FIG. 5, unlike the control circuit for a read operation shown in FIG. 2, a second delay unit 321 generates a first pipe latch control signal 'PIN1' and a second pipe latch control signal 'PIN2' using the sensing-enable signal 'IOSTB' and the clock 'CLK', respectively. For this operation, the second delay unit 321 is configured as shown in FIG. 3.

That is, the second delay unit 321 can also include a first delayer outputting the first pipe latch control signal 'PIN1' by delaying the sensing-enable signal 'IOSTB' for a predetermined time, a latch for shifting the sensing-enable signal 'IOSTB' in synchronization with the clock 'CLK', and a second delayer outputting the second pipe latch control signal 'PIN2' by delaying an output signal of the latch for a predetermined time.

In this circuit configuration, the clock 'CLK' that is inputted to the first delay unit 315 and the clock 'CLK' that is inputted to the second delay unit 321 should be controlled such that they do not have a time difference.

In this embodiment, when data is transmitted to the multiplexer 311 and when the data stored in the multiplexer 311 is transmitted to the pipe latch 313, delay signals are used that have been generated in the same manner, i.e., using the same signal inputs and the same circuit configuration for each delay unit. Therefore, the point in time when data is transmitted to the multiplexer 311 and a point in time when the pipe latch 313 stores the data do not overlap.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A control circuit of a read operation for a SERDES (SERializer and DESeriallizer) type semiconductor memory apparatus, comprising:
    a first delay unit configured to generate and output a first delay signal to a first global input/output line driver according to a received sensing-enable signal 'IOSTB', and to generate and output a second delay signal to a second global input/output line driver according to the received sensing-enable signal and generating the second delay signal by delaying the sensing-enable signal in synchronization with a clock received by the first delay unit; and
    a second delay unit configured to generate a pipe latch control signal in response to the first delay signal and the second delay signal.

2. The control circuit of a read operation according to claim 1, wherein the first delay unit includes:
    a first delayer configured to output the first delay signal by delaying the sensing-enable signal 'IOSTB' for a predetermined time;
    a latch configured to shift the sensing-enable signal in synchronization with the clock; and
    a second delayer configured to output the second delay signal by delaying an output signal of the latch for a predetermined time.

3. The control circuit of a read operation according to claim 2, wherein the latch is a flipflop configured to delay the sensing-enable signal in response to the clock.

4. The control circuit of a read operation according to claim 2, wherein the delay amount of the first delayer and the second delayer are the same.

5. The control circuit of a read operation according to claim 1, wherein the second delay unit includes a logic element configured to output a pulse when the first delay signal and the second delay signal are inputted to the second delay unit and when one of the inputted signals is enabled.

6. The control circuit of a read operation according to claim 1, further comprising a signal separating unit configured to output a first pipe latch control signal and a second pipe latch control signal according to the pipe latch control signal outputted from the second delay unit and received at the signal separating unit.

7. The control circuit of a read operation according to claim 6, wherein the signal separating unit includes a counter configured to receive the pipe latch control signal from the second delay unit and count and output the number of pulses of the pipe latch control signal from the second delay unit.

8. A control circuit of a read operation for a SERDES (SERializer and DESerializer) type semiconductor memory apparatus, comprising:
   a first delay unit configured to generate and output a first delay signal to a first global input/output line driver according to a received sensing-enable signal 'IOSTB', and to generate and output a second delay signal to a second global input/output line driver according to the received the sensing-enable signal by delaying the sensing-enable signal in synchronization with a clock received by the first delay unit; and
   a second delay unit configured to generate a third delay signal by receiving the sensing-enable signal 'IOSTB' and to output the third delay signal as a first pipe latch control signal, and to generate a fourth delay signal by delaying the received sensing-enable signal in synchronization with the clock and to output the fourth delay signal as a second pipe latch control signal.

9. The control circuit of a read operation according to claim 8, wherein the first delay unit includes:
   a first delayer configured to output the first delay signal by delaying the sensing-enable signal 'IOSTB' for a predetermined time;
   a latch configured to shift the sensing-enable signal in synchronization with the clock; and
   a second delayer configured to output the second delay signal by delaying an output signal of the latch for a predetermined time.

10. The control circuit of a read operation according to claim 9, wherein the latch is a flipflop configured to delay the sensing-enable signal in response to the clock.

11. The control circuit of a read operation according to claim 9, wherein the delay amount of the first delayer and the second delayer are the same.

12. The control circuit of a read operation according to claim 8, wherein the second delay unit includes:
   a first delayer configured to output the third delay signal by delaying the sensing-enable signal 'IOSTB' for a predetermined time;
   a latch configured to shift the sensing-enable signal in synchronization with the clock; and
   a second delayer configured to output the fourth delay signal by delaying an output signal of the latch for a predetermined time.

13. The control circuit of a read operation according to claim 12, wherein the latch is a flipflop configured to delay the sensing-enable signal in response to the clock.

14. The control circuit of a read operation according to claim 12, wherein the delay amount of the first delayer and the second delayer are the same.

15. A control circuit of a read operation for a SERDES (SERializer and DESeriallizer) type semiconductor memory apparatus, comprising:
   a first delay unit outputting a first delay signal to a first input/output line driver, and outputting a second delay signal synchronized with a clock to a second input/output line driver; and
   a second delay unit outputting a control signal in response to the first delay signal and the second delay signal.

16. A control circuit of a read operation for a SERDES (SERializer and DESeriallizer) type semiconductor memory apparatus, comprising:
   a first delay unit outputting a first delay signal to a first line driver, and outputting a second delay signal synchronized with a clock to a second line driver; and
   a second delay unit outputting a first control signal in accordance with a third delay signal, and outputting a second control signal in accordance with a fourth delay signal synchronized with the clock.

* * * * *